United States Patent
Yuri et al.

(10) Patent No.: US 6,197,441 B1
(45) Date of Patent: Mar. 6, 2001

(54) CUBIC NITRIDE SEMICONDUCTOR DEVICE AND FABRICATION METHOD OF THE SAME

(75) Inventors: Masaaki Yuri, Osaka (JP); Tetsuzo Ueda, Menlo Park; Takaaki Baba, Los Altos, both of CA (US)

(73) Assignee: Matsushita Electronics Corporation, Osaka (JP)

(*) Notice: Subject to any disclaimer, the term of this patent is extended or adjusted under 35 U.S.C. 154(b) by 0 days.

(21) Appl. No.: 09/124,889

(22) Filed: Jul. 30, 1998

(30) Foreign Application Priority Data

Jul. 31, 1997 (JP) .................................................. 9-205673

(51) Int. Cl.$^7$ .................................................. H01L 21/203
(52) U.S. Cl. .................................................. 428/698; 438/489
(58) Field of Search .............................. 428/698; 438/489

(56) References Cited

U.S. PATENT DOCUMENTS

| | | | |
|---|---|---|---|
| 3,798,061 | * 3/1974 | Yamazaki | 427/583 |
| 3,856,587 | * 12/1974 | Yamazaki et al. | 438/591 |
| 4,448,633 | * 5/1984 | Shuskus | 438/767 |
| 4,914,059 | * 4/1990 | Nissim et al. | 438/590 |
| 5,585,304 | * 12/1996 | Hayashi et al. | 438/459 |
| 5,866,463 | * 2/1999 | Hirai et al. | 438/381 |

FOREIGN PATENT DOCUMENTS 61-214437   9/1986  (JP).

OTHER PUBLICATIONS

"Transmission Electron///Dimethylhydrazine on (001) GaAs" Jpn. J. Appl. Phys. vol. 33 (1994) pp. 18–22, Jan. 1994.

* cited by examiner

Primary Examiner—Francis J. Lorin
(74) Attorney, Agent, or Firm—McDermott, Will & Emery

(57) ABSTRACT

The object of the present invention is to form a cubic nitride semiconductor layer of excellent surface flatness and crystallization on a cubic III–V family compound semiconductor substrate, featuring a fabrication method that comprises the steps of forming a cubic semiconductor layer 2 containing aluminum, nitriding one surface of the semiconductor layer 2 by heating in an atmosphere of a nitrogen compound and then supplying a nitrogen compound and a compound containing III family elements to form a cubic nitride semiconductor layer 3 on the semiconductor layer 2.

14 Claims, 4 Drawing Sheets

(a)

(b)

(c)

(a)

(b)

(c)

(a)

(b)

CUBIC NITRIDE SEMICONDUCTOR DEVICE AND FABRICATION METHOD OF THE SAME

BACKGROUND OF THE INVENTION

The present invention relates to a cubic nitride semiconductor device and a fabrication method of the same.

Cubic nitride semiconductors such as gallium nitride, indium nitride, aluminum nitride and the like are ideal as materials for use in a blue semiconductor laser device, a high-speed transistor of high operating temperatures and the like.

A method for fabricating prior art cubic nitride semiconductor devices will be explained in the following.

FIG. 4 shows a fabrication process of a prior art cubic nitride semiconductor device.

First, a GaAs substrate 4 as shown in FIG. 4(a) is placed in a growth reaction furnace and then heated to about 600° C. in an atmosphere of an As compound, thereby eliminating oxides from the surface of the GaAs substrate 4. Next, the atmosphere of the growth reaction furnace is changed from the As compound to a nitrogen compound such as ammonia ($NH_3$), dimethylhydrazin(($CH_3)_2$—$N_2$—$H_2$) or the like and then the heat application process follows in succession. This heat application process is generally referred to as "surface nitriding", whereby As atoms on the surface of GaAs substrate 4 are replaced with N atoms thus having a thin film of GaN crystals formed on the surface of GaAs substrate 4. Then, with a Ga compound furnished, a GaN crystal layer 5, which is a cubic nitride semiconductor, is formed on the GaAs substrate 4 as shown in FIG. 4(b).

In place of the GaAs substrate 4, a gallium phosphide (GaP) substrate, silicon(Si) substrate or the like is also used.

According to the prior art method for fabricating cubic nitride semiconductor devices, however, Ga atoms or GaN molecules are left on the substrate surface when As atoms are replaced with N atoms during the process of surface nitriding. These Ga atoms and GaN molecules, showing high surface mobility and because of mobile force exercised in a direction to mitigate a large amount of surface energy created by a lattice mismatch, move readily on the surface of GaAs substrate, with a confirmed result of having facet-like projections and depressions of several tens to hundreds of angstroms in height formed on the surface of GaAs substrate. (Refer to Japanese Journal of Applied Physics, Volume 33 of 1994, pp. 18–22.) Once these projections and depressions have been formed, the surface morphology of GaN crystal layer thereafter is changed for the worse, having hexagonal nitride semiconductors mixed in the GaN crystal layer with a resulting problem of reducing extensively the crystallization of GaN crystal layer.

SUMMARY OF THE INVENTION

The object of the present invention is to provide a cubic nitride semiconductor device, which enables a cubic nitride semiconductor of excellent crystallization to be formed on a substrate by surface nitriding without any projections and depressions formed on the substrate, and to disclose a fabrication method of the same.

A cubic nitride semiconductor device of the present invention is characterized by nitriding one of the surfaces of a semiconductor layer of cubic system containing aluminum and having a cubic nitride semiconductor layer formed on the foregoing surface.

A fabrication method of a cubic nitride semiconductor device of the present invention comprises the steps of forming a semiconductor layer of cubic system containing aluminum, nitriding one of the surfaces of the foregoing semiconductor layer by heating the semiconductor layer in an atmosphere of a nitrogen compound and then forming a cubic nitride semiconductor layer by furnishing a nitrogen compound and a compound containing III family elements on the foregoing semiconductor layer.

According to the present invention, since atoms of aluminum having extremely small surface mobility exist in a semiconductor layer, surface diffusion of III family elements and compound molecules of III family atoms and nitrogen is prevented from taking place, thereby making it possible to perform surface nitriding while keeping the surface of semiconductor layer flat. As a result, a flat cubic nitride semiconductor layer can be formed on a semiconductor layer with surface nitriding applied thereto.

DETAILED DESCRIPTION OF THE PREFERRED EMBODIMENTS

Figure 1:
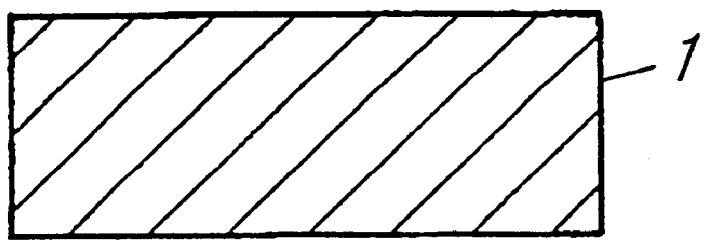
FIG. 1 shows a fabrication method of a cubic nitride semiconductor device in a first exemplary embodiment of the present invention.
Figure 1:
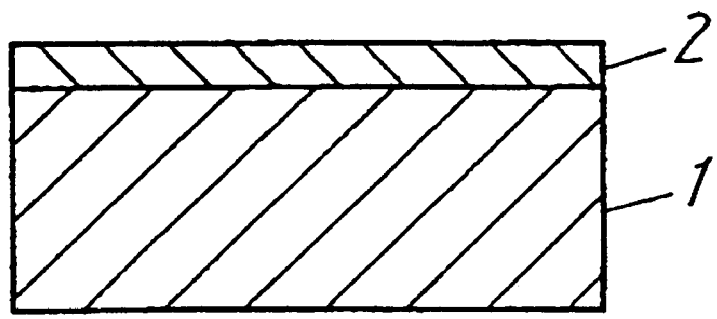
Figure 1:
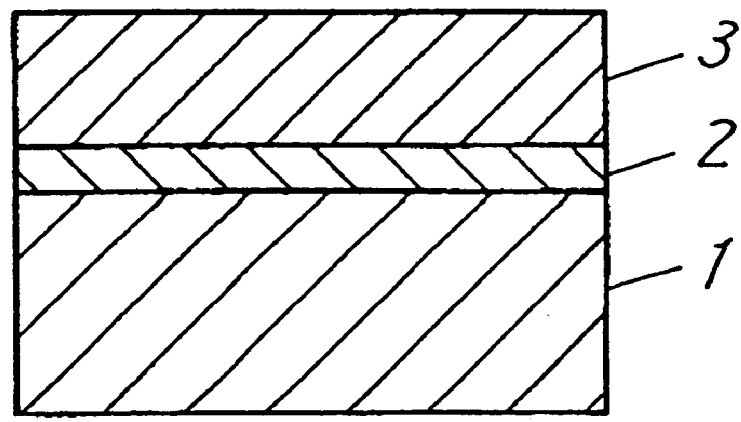

Next, some of the preferred embodiments of the present invention will be explained with reference to FIG. 1 through FIG. 3.

(First Exemplary Embodiment)

FIG. 1(c) is a cross-sectional view of a cubic nitride semiconductor device in a first exemplary embodiment of the present invention. As shown in FIG. 1(c), a semiconductor layer 2 with a composition of $Al_{0.3}Ga_{0.7}As$ and a cubic nitride semiconductor layer 3 composed of GaN are formed in succession in this order on a substrate 1 composed of GaAs. Further, surface nitriding is applied to the surface of semiconductor layer 2 that is in contact with the cubic nitride semiconductor layer 3.

Next, a fabrication method of a cubic nitride semiconductor device will be explained with reference to FIG. 1(a) to FIG. 1(c).

First, oxides are eliminated from the surface of substrate 1 by having the substrate 1 of FIG. 1(a) heated to about 600° C. while having As molecular beams irradiated on the substrate 1 in molecular beam epitaxy(MBE) equipment. Then, the semiconductor layer 2 with a composition of $Al_{0.3}Ga_{0.7}As$ is formed as shown in FIG. 1(b) with Ga and Al being supplied and the supply of Al, Ga and As is stopped when the thickness of the semiconductor layer 2 has reached about 0.1 μm.

Then, irradiation of dimethylhydrazine is started to perform surface nitriding of the semiconductor layer 2. During the process of surface nitriding, RHEED patterns are monitored in order to observe crystallization of the surface of semiconductor layer 2, and when an RHEED pattern indicating the existence of $Al_{0.3}Ga_{0.7}As$ is shifted to another RHEED pattern indicating the existence of $Al_{0.3}Ga_{0.7}N$, it can be known that several layers of atoms of As existing on the surface of semiconductor layer 2 have been replaced with atoms of N, that is to say that surface nitriding of the semiconductor layer 2 has taken place. In the present first exemplary embodiment, about 5 minutes have passed from the time when the supply of dimethylhydrazine was started till the time when the afore-mentioned shifting in RHEED pattern was observed.

After this transition in RHEED pattern has been recognized, Ga is supplied in addition to dimethylhydrazine, thereby making a cubic nitride semiconductor layer 3 formed of GaN grow.

In the first exemplary embodiment, from the time when surface nitriding started till the time when growth of the cubic nitriding semiconductor layer 3 ended, a streak-like RHEED pattern was being observed, thus indicating the surface of semiconductor layer 2 where surface nitriding took place and the surface of cubic nitride semiconductor layer 3 are flat in terms of atomic layer level. Consequently, a confirmation of excellent crystallization of the cubic nitride semiconductor layer 3 was made possible.

Figure 2:
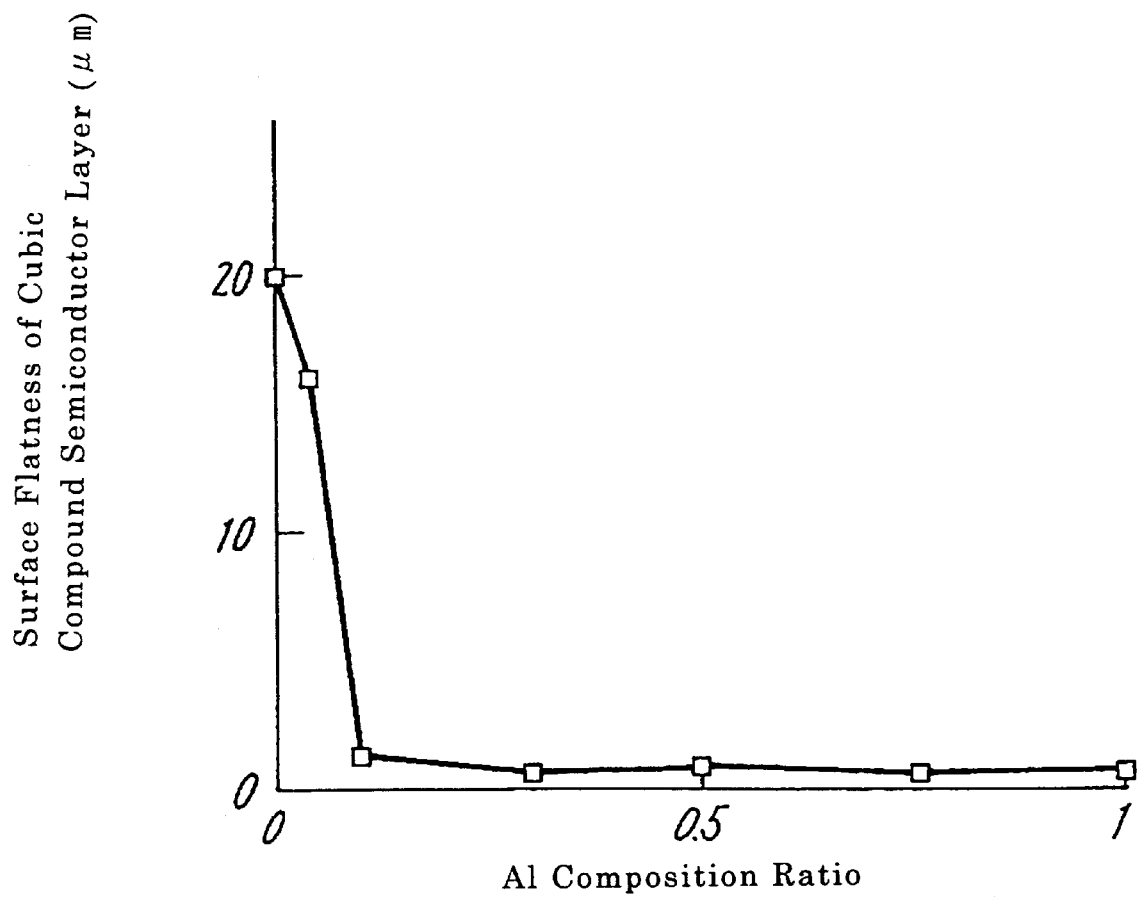
FIG. 2 is a diagram to show a relationship between the Al composition ratio and the surface flatness of cubic nitride semiconductor layer in the semiconductor layer of a cubic nitride semiconductor device in the first exemplary embodiment of the present invention.
Figure 3:
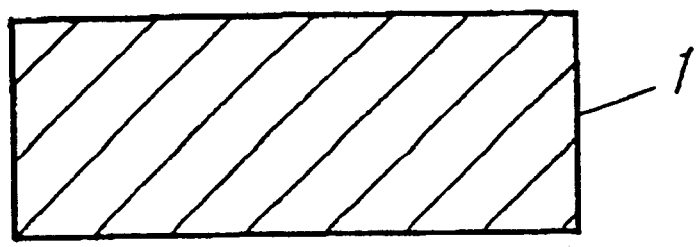
FIG. 3 shows a fabrication method of a cubic nitride semiconductor device in a second exemplary embodiment of the present invention.
Figure 3:
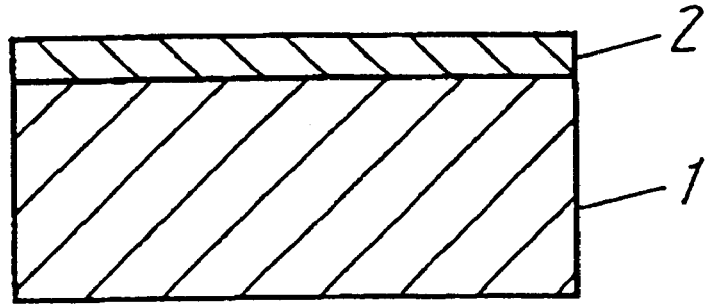
Figure 3:
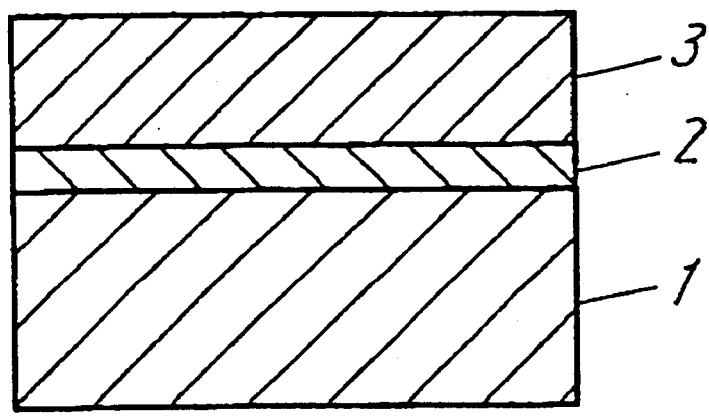
Figure 4:
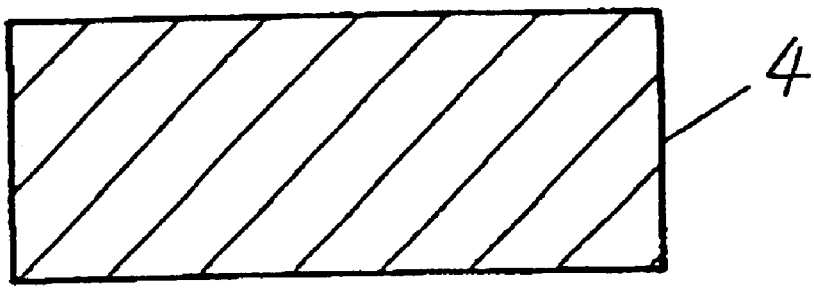
FIG. 4 shows a prior art fabrication method of a cubic nitride semiconductor device.
Figure 4:
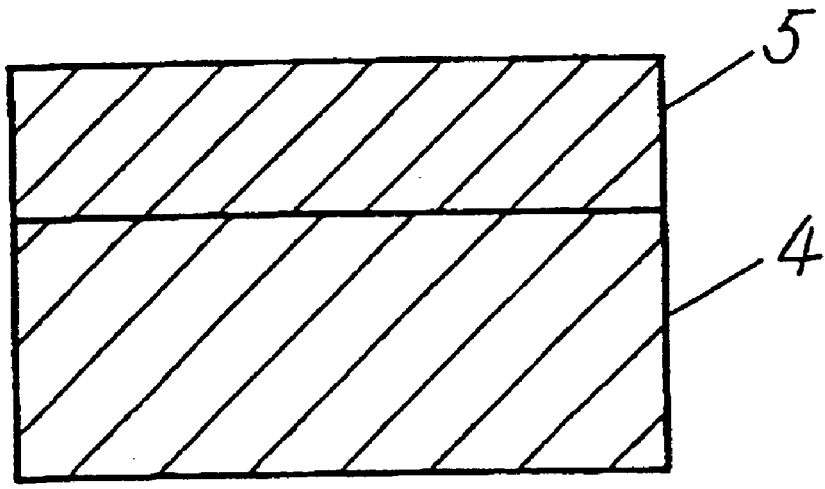

FIG. 2 shows a relationship between the Al composition ratio of the semiconductor layer 2 and the surface flatness of the cubic nitride semiconductor layer 3. As clearly shown in FIG. 2, when Al is contained in the semiconductor layer 2, the surface flatness of the cubic nitride semiconductor layer 3 is improved. Particularly, when the Al composition ratio is 0.1 or more, the surface flatness of the cubic nitride semiconductor layer 3 has improved by about 20 times as compared with the case wherein no Al is contained.

Also, it was confirmed that a composition formula of $Al_xGa_yIn_{1-x-y}As$, wherein $0<x\leq1$, $0\leq y\leq1$ and $0<x+y\leq1$, is generally applicable to the semiconductor layer 2 and a composition formula of $Al_uGa_vIn_{1-u-v}N$, wherein $0\leq u\leq1$, $0\leq v\leq1$ and $0\leq u+v\leq1$, is generally applicable to the cubic nitride semiconductor layer 3.

(Second Exemplary Embodiment)

FIG. 3(c) is a cross-sectional view of a cubic nitride semiconductor device in a second exemplary embodiment of the present invention. As shown in FIG. 3(c), a semiconductor layer 2 with a composition of $Al_{0.1}Ga_{0.9}P$ and a cubic nitride semiconductor layer 3 composed of GaN are formed in succession in this order on a substrate 1 composed of GaP. Further, a process of surface nitriding is applied to the surface of semiconductor layer 2 that is in contact with the cubic nitride semiconductor layer 3.

Next, a fabrication method of a cubic nitride semiconductor device will be explained with reference to FIG. 3(a) to FIG. 3(c).

First, oxides are eliminated from the surface of substrate 1 by having the substrate 1 of FIG. 3(a) heated to about 700° C. while having P molecular beams irradiated on the substrate 1 in molecular beam epitaxy(MBE) equipment. Then, the semiconductor layer 2 with a composition of $Al_{0.1}Ga_{0.9}P$ is formed to a thickness of about 0.1 μm as shown in FIG. 3(b) with a supply of Ga and Al and then the supply of Al, Ga and P is stopped.

After this, a cubic nitride semiconductor device is fabricated in the same manner as in the first exemplary embodiment. In this case, the process of surface nitriding of the semiconductor layer 2 took about 10 minutes.

In the second exemplary embodiment, too, a streak-like RHEED pattern was being observed from the time when the process of surface nitriding started till the time when growth of the cubic nitriding semiconductor layer 3 ended, thus indicating that the surface of semiconductor 2 where the process of surface nitriding took place and the surface of cubic nitride semiconductor layer 3 are flat at an atomic layer level, thereby making it possible to confirm that a cubic nitride semiconductor layer 3 of excellent crystallization has been formed.

Although a substrate 1 was used in the first and second exemplary embodiments as described in the above, a cubic nitride semiconductor device can be produced without using the substrate 1 if a semiconductor layer 2 is thick enough to be used as a substrate.

Also, it was confirmed that a composition formula of $Al_xGa_yIn_{1-x-y}P$, wherein $0<x\leq1$, $0\leq y\leq1$ and $0<x+y\leq1$, is generally applicable to the semiconductor layer 2 and a composition formula of $Al_uGa_vIn_{1-u-v}N$, wherein $0\leq u\leq1$, $0\leq v\leq1$ and $0\leq u+v\leq1$, is generally applicable to the cubic nitride semiconductor layer 3.

Further, even when a III–V family compound semiconductor containing In, such as InAs, InP or the like is used as a substrate, or such a raw material as ammonia, a nitrogen radical or the like is used as a nitrogen compound for surface nitriding, the same effect can be obtained.

In addition, use of methods other than molecular beam epitaxy, such as an MOCVD method and a halide VPE method, can achieve the same effect in performing crystal growth.

Accordingly, the present invention has been proved effective in enabling the supply of a cubic nitride semiconductor device that has a cubic nitride semiconductor layer of excellent crystallization.

What is claimed is:

1. A cubic nitride semiconductor device characterized by nitriding
   one surface of a cubic semiconductor layer containing aluminum and forming a cubic nitride semiconductor layer on said surface.

2. The cubic nitride semiconductor device according to claim 1, wherein said cubic semiconductor layer has a composition formula of $Al_xGa_yIn_{1-x-y}As$ ($0<x\leq1$, $0\leq y\leq1$, $0<x+y\leq1$) and said cubic nitride semiconductor layer has a composition formula of $Al_uGa_vIn_{1-u-v}N$ ($0\leq u\leq1$, $0\leq v\leq1$, $0\leq u+v\leq1$).

3. The cubic nitride semiconductor device according to claim 1, wherein said cubic semiconductor layer has a composition formula of $Al_xGa_yIn_{1-x-y}P$ ($0<x\leq1$, $0\leq y\leq1$, $0<x+y\leq1$) and said cubic nitride semiconductor layer has a composition formula of $Al_uGa_vIn_{1-u-v}N$ ($0\leq u\leq1$, $0\leq v\leq1$, $0\leq u+v\leq1$).

4. A fabrication method of a cubic nitride semiconductor device comprising the steps of:
   forming a cubic semiconductor layer containing aluminum;
   nitriding one surface of said semiconductor layer by heating said semiconductor layer in an atmosphere of a nitrogen compound; and then
   forming a cubic nitride semiconductor layer on said cubic semiconductor layer by supplying a nitrogen compound and a compound containing III family elements.

5. A method of fabricating a cubic nitride semiconductor device according to claim 4, wherein
   said cubic semiconductor layer has a composition formula of $Al_xGa_yIn_{1-x-y}As$ ($0<x\leq1$, $0\leq y\leq1$, $0<x+y\leq1$) and said cubic nitride semiconductor layer has a composition formula of $Al_uGa_vIn_{1-u-v}N$ ($0\leq u\leq1$, $0\leq v\leq1$, $0\leq u+v\leq1$).

6. A method of fabricating a cubic nitride semiconductor device according to claim 4, wherein
   said cubic semiconductor layer has a composition formula of $Al_xGa_yIn_{1-x-y}P$ ($0<x\leq1$, $0\leq y\leq1$, $0<x+y\leq1$) and said cubic nitride semiconductor layer has a composition formula of $Al_uGa_vIn_{1-u-v}N$ ($0 \leq u \leq 1$, $0 \leq v \leq 1$, $0 \leq u+v \leq 1$).

7. The cubic nitride semiconductor device according to claim 2, wherein $0.1 \leq x \leq 1$ and y=1−x.

8. The cubic nitride semiconductor device according to claim 3, wherein $0.1 \leq x \leq 1$ and y=1−x.

9. The method of fabricating a cubic nitride semiconductor device according to claim 5, wherein $0.1 \leq x \leq 1$ and y=1−x.

10. The method of fabricating a cubic nitride semiconductor device according to claim 6, wherein $0.1 \leq x \leq 1$ and y=1−x.

11. A method of fabricating a cubic nitride semiconductor device according to claim 4, wherein the step of nitriding further comprises a step of:

monitoring RHEED patterns to observe crystallization of the surface of said cubic semiconductor layer containing aluminum.

12. A method of fabricating a cubic nitride semiconductor device according to claim 11, wherein said a cubic nitride semiconductor layer is formed after a first observed RHEED pattern is shifted to a second observed RHEED pattern.

13. The cubic nitride semiconductor device according to claim 1, wherein said cubic nitride semiconductor layer on said surface is flat in terms of atomic layer level.

14. A method of fabricating a cubic nitride semiconductor device according to claim 4, wherein said cubic nitride semiconductor layer on said cubic semiconductor surface is flat in terms of atomic layer level.

* * * * *